US006988693B2

(12) United States Patent
Shelly

(10) Patent No.: US 6,988,693 B2
(45) Date of Patent: Jan. 24, 2006

(54) METHODS AND APPARATUS FOR PASSIVE ILLUMINATION OF REFUELING HOSES

(75) Inventor: Mark A. Shelly, Bel Aire, KS (US)

(73) Assignee: The Boeing Company, Chicago, IL (US)

(*) Notice: Subject to any disclaimer, the term of this patent is extended or adjusted under 35 U.S.C. 154(b) by 0 days.

(21) Appl. No.: 10/627,900

(22) Filed: Jul. 25, 2003

(65) Prior Publication Data

US 2005/0145751 A1 Jul. 7, 2005

(51) Int. Cl.
*B64D 37/00* (2006.01)

(52) U.S. Cl. .................................. 244/135 A; 244/136

(58) Field of Classification Search ............ 244/135 A, 244/135 R, 136

See application file for complete search history.

(56) References Cited

U.S. PATENT DOCUMENTS

| | | | | |
|---|---|---|---|---|
| 2,998,949 | A | 9/1961 | Patterson | |
| 4,398,685 | A | 8/1983 | Task et al. | |
| 4,633,376 | A | 12/1986 | Newman | |
| 4,644,895 | A * | 2/1987 | Cozad | 116/200 |
| 4,763,861 | A | 8/1988 | Newman | |
| 5,063,607 | A | 11/1991 | FitzHenry et al. | |
| 5,326,052 | A * | 7/1994 | Krispin et al. | 244/135 A |
| 5,539,624 | A | 7/1996 | Dougherty | |
| 5,573,206 | A | 11/1996 | Ward | |
| 5,718,956 | A * | 2/1998 | Gladfelter et al. | 428/35.9 |
| 5,835,271 | A * | 11/1998 | Stump et al. | 359/529 |
| 5,872,595 | A | 2/1999 | Monahan | |
| 5,982,424 | A | 11/1999 | Simerly et al. | |
| 5,996,939 | A | 12/1999 | Higgs et al. | |
| 6,079,135 | A * | 6/2000 | Ruiz | 40/316 |
| 6,137,533 | A | 10/2000 | Azim | |
| 6,252,536 | B1 | 6/2001 | Johnson et al. | |
| 6,257,750 | B1 | 7/2001 | Strasser et al. | |
| 6,366,367 | B1 | 4/2002 | Schreier et al. | |
| 6,644,594 | B1 * | 11/2003 | Hunn et al. | 244/135 R |
| 6,651,933 | B1 * | 11/2003 | von Thal et al. | 244/136 |

FOREIGN PATENT DOCUMENTS

| | | |
|---|---|---|
| EP | 0126306 | 4/1983 |
| FR | 2648431 | 6/1989 |
| GB | 2353082 | 2/2001 |

OTHER PUBLICATIONS http://www.unitika.co.jp/e/object/kino/02.htm Unitika Ltd., "Advanced materials: Glass Fibers With Original Functions Enable a Wealth of Applications" Jul. 10, 2003, pp. 1-3.

http://www.unibeads.com/p044.html Union Co., Ltd., Business Activities; Manufacture and Sales of Glass Beads, Jul. 10, 2003, 1 pg.

* cited by examiner

*Primary Examiner*—J. Woodrow Eldred
(74) *Attorney, Agent, or Firm*—Black Lowe & Graham, PLLC

(57) ABSTRACT

Methods and apparatus for illumination of aerial refueling hoses are disclosed. In one embodiment, a conduit for transferring a flowable material includes a wall member. A plurality of reflective members are at least one of formed within an outer layer of the wall member and disposed on an outer surface of the wall member. The reflective members are adapted to at least partially reflect light incident thereon. In one aspect, the reflective members include reflective glass beads. In a further aspect, a first portion of the wall member has a first concentration of reflective members, and a second portion has a second concentration of reflective members.

24 Claims, 2 Drawing Sheets

200 210 218c 218b 218a 220 222 226 212 216 224 214

METHODS AND APPARATUS FOR PASSIVE ILLUMINATION OF REFUELING HOSES

FIELD OF THE INVENTION

The present invention relates to methods and apparatus for passive illumination of refueling hoses, including, for example, refueling hoses for aerial refueling systems and the like.

BACKGROUND OF THE INVENTION

Aerial refueling is commonly employed to increase the range and flight duration of an aircraft. Some types of aerial refueling systems include a hose having a drogue attached thereto which trails or drags behind a fuel tanker. On the end of the hose is a "basket" which includes a reception coupling. The receiver aircraft includes a probe (or fuel inlet) that may be fixed or retractable. When the receiver aircraft needs to be aerial refueled, it approaches the tanker and then flies formation on the trailing aerial refueling hose, slowly approaching the reception coupling. Eventually the receiving aircraft "stabs" or engages the probe into the reception coupling, thereby providing a connection for transferring fuel between the tanker and the receiver aircraft. Known hose and drogue aerial refueling systems include, for example, those systems disclosed by U.S. Pat. No. 5,573,206 issued to Ward, and U.S. Pat. No. 5,539,624 issued to Dougherty.

Typically, in order to initiate the tanker refueling pumps to commence the fuel transfer from the tanker to the receiver aircraft, the receiver aircraft must engage the probe into the refueling hose coupling and push the hose in past the outer refueling limit. The receiver can push beyond the minimum to receive fuel from the tanker. Fuel flow will continue as long as the receiver aircraft keeps the hose in the "refueling envelope". Typically the receiver aircraft pushes to a range, somewhere in the middle of the refueling envelope. If the receiver aircraft pushes the hose in to the inner refueling limit, the tanker fuel system will shut down, ceasing fuel transfer to the receiver aircraft. If the receiver aircraft pulls out to where it is back in the refueling envelope, fuel transfer will reinitiate. Upon completion of the refueling process, the receiver aircraft continues to back out until the tanker hose is fully deployed. At this point, if the receiver aircraft backs out further, the connection between the tanker reception coupling and the receiver aircraft probe is released. During this whole process, as the receiver aircraft pushes and pulls on the hose, the tanker hose reel system winds and unwinds the hose on a tanker mounted hose reel to keep the slack out of the hose.

Although desirable results have been achieved using prior art aerial refueling systems, some drawbacks have been noted. For example, during some operating conditions, the refueling hose may be difficult for the personnel on board the receiver aircraft to see. Glints, shadows and glare caused by the sun, atmospheric water vapor, or reflections from aircraft surfaces may hamper visibility of the refueling hose during daylight operations. Similarly, darkness or relatively low lighting conditions may obscure visibility of the refueling hose during nighttime operations. Furthermore, the markings that are normally placed on the hose to designate the inner, center, and outer refueling envelope may be equally difficult to observe. Thus, there exists a need for an improved aerial refueling system that reduces adverse viewing conditions and improves the ability of the personnel on the receiver aircraft to view the refueling hose during varying lighting conditions.

SUMMARY OF THE INVENTION

The present invention is directed to methods and apparatus for passive illumination of refueling hoses, including, for example, refueling hoses for aerial refueling systems and the like. Apparatus and methods in accordance with the present invention may advantageously provide improved visibility of refueling hoses for aerial refueling operations during daytime and night, without requiring the provision of electrical power or moving parts. Thus, the efficiency, safety, and reliability of aerial refueling operations may be improved.

In one embodiment a conduit for transferring a flowable material includes a wall member at least partially enclosing an inner region, the inner region being adapted to receive the flowable material and to facilitate transfer of the flowable material from a first location to a second location. A plurality of reflective members are at least one of formed within an outer layer of the wall member and disposed on an outer surface of the wall member. The reflective members are adapted to at least partially reflect light incident thereon. In one embodiment, the reflective members include reflective glass beads. In a further embodiment, the wall member includes a first portion and a second portion, the first portion having a first concentration of reflective members and the second portion having a second concentration of reflective members.

BRIEF DESCRIPTION OF THE DRAWINGS

The preferred and alternative embodiments of the present invention are described in detail below with reference to the following drawings.

DETAILED DESCRIPTION OF THE INVENTION

The present invention is directed to methods and apparatus for passive illumination refueling holes. Many specific details of certain embodiments of the invention are set forth in the following description and in FIGS. 1–4 to provide a thorough understanding of such embodiments. One skilled in the art, however, will understand that the present invention may have additional embodiments, or that the present invention may be practiced without several of the details described in the following description.

Figure 1:
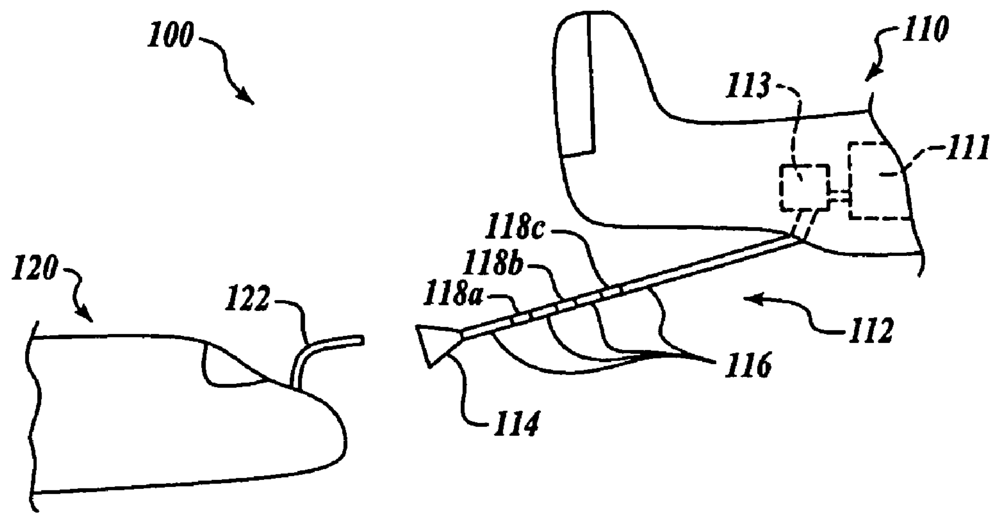
FIG. 1 is a side elevational view of an aerial refueling system in accordance with an embodiment of the present invention.

FIG. 1 is a side elevational view of an aerial refueling system 100 in accordance with an embodiment of the present invention. In this embodiment, the aerial refueling system 100 includes a tanker aircraft 110 having a refueling hose 112, along with a fuel tank 111 and a pump 113, both of conventional design, to enable the delivery of fuel. A drogue 114 is coupled to the end of the refueling hose 112. The refueling hose 112 has an outer surface that includes a plurality of first portions 116 and a plurality of second portions 118.

As further shown in FIG. 1, a receiving aircraft 120 having a fuel receptacle or probe 122 may be flown proximate to the tanker aircraft 110. In operation, the probe 122 may be inserted into the refueling hoe 112 so that fuel or other materials may be transferred through the hose 112 into the probe 122 and into the receiving aircraft 120.

In this embodiment, the second portions 118 are characterized by a greater reflectivity than the first portions 116, as described more fully below. The second portions 118 may be distributed on the refueling hose 112 to correspond to an outer refueling limit (i.e. a minimum length that the probe must engage into the refueling hose to initiate fuel transfer, designated as the second portion 118*a*), an inner refueling limit (i.e. a maximum length that the probe may engage into the refueling hose, beyond which fuel transfer is terminated, designated as the second portion 118*c*), and an intermediate or midpoint refueling position (i.e. second portion 118*b*). In alternate embodiments, the positions of the second portions 118 may be varied from the particular embodiment shown in FIG. 1, or alternately, a greater or fewer number of second portions 118 may be employed. In a particular embodiment, the second portions 118 may be eliminated.

In one aspect of the invention, the reflectivity of the second portions 118 may be provided by reflective members. The reflective members may, for example, be embedded in an outer layer of the refueling hose 112, or may be included within a paint or other coating material that is used in forming the second portions 118 on the refueling hose 112. In a particular aspect of the invention, the reflective members may be reflective glass beads. Suitable reflective glass beads include, for example, those beads commercially-available from 3M of St. Paul, Minn., or from Union Co., Ltd. of Osaka, Japan. In alternate embodiments, the reflective members may be other types of reflective devices or reflective materials, including, for example, metallic beads, metallic flakes, sea shells, quartz crystals, or any other suitable reflective devices or reflective materials, or combinations thereof. The second portions 118 of the refueling hose 112 may be characterized by a relatively higher concentration of reflective members compared with the first portions 116 to provide the desired level of contrast between the first and second portions 116, 118.

In another aspect of the invention, the first portions 116 of the refueling hose 112 may also include reflective members. In the embodiment shown in FIG. 1, the density of reflective members in the first portions 116 of the hose 112 is relatively lower than in the second portions 118. Alternately, the first portions 116 of the refueling hose 112 may simply have the conventional reflectivity level provided by the standard outer surface of the conventional, prior art refueling hose 112.

In operation, the refueling hose 112 may advantageously provide improved visibility during daylight and night operations. For example, by applying a relatively low density of reflective members (e.g. reflective glass beads) within the first portions 116 of the refueling hose 112, the first portions 116 may exhibit a relatively dark (or black) appearance during daylight operations. Conversely, during low-light (or night) operations, the first portions 116 may passively reflect light from secondary sources (e.g. lights on the tanker aircraft 110 and the receiver aircraft 120, moonlight, etc.), and may exhibit a relatively light (or white) appearance. Because there is typically enough light from secondary sources around the aerial refueling system 100 during night operations, the reflective glass beads within the first portion 116 may advantageously be passively illuminated. Because a relatively darker refueling hose is typically easier to see during daylight operations, and a relatively lighter refueling hose is typically easier to see during night operations, the refueling hose 112 advantageously improves visibility of the refueling hose 112 during both daylight and night operations in comparison with prior art hoses.

Similarly, the refueling hose 112 having a relatively high concentration of reflective members within the second portions 118 may permit the markings or bands on the refueling hose 112 to be seen during both daylight and low-light operations. A relatively higher concentration of reflective members within the second portions 118 may advantageously provide a relatively high contrast with the first portions 116. During night operations, the relatively higher density of reflective members within the second portions 118 may advantageously cause the markings or bands corresponding to the second portions 118 to stand out brightly when passively illuminated with secondary light sources. In one exemplary embodiment, the second portions 118 are of sufficient contrast to stand out brightly in typical secondary source illumination conditions, whereas the first portions 116 are of a lesser concentration of reflective members so that the first portions 116 are illuminated more faintly, permitting the refueling hose 112 to be visible but enabling easy visualization of the markings/bands (i.e. second portions 118).

Furthermore, the refueling hose 112 having at least one of the first and second portions 116, 118 that include reflective members provides numerous additional advantages over alternate methods of hose illumination. For example, embodiments of refueling hoses in accordance with the present invention require no additional electrical power to achieve the desired lighting of the refueling hose during night operations. Because refueling hoses in accordance with the present invention rely on simple, passive illumination, the cost and complexity of the device is reduced, and reliability is increased, compared with alternate methods of illumination. Embodiments of refueling hoses in accordance with the present invention require virtually no additional moving parts and are practically maintenance free. Finally, as stated above, embodiments of the present invention may improve visibility of refueling hoses during both daytime and night operations.

It will be appreciated that embodiments of apparatus and methods in accordance with the present invention may be employed in conjunction with a wide variety of tanker and receiver aircraft. For example, the tanker aircraft 110 may be any desired tanker aircraft, including, for example, a 767 Global Tanker Transport Aircraft (manufactured by The Boeing Company of Chicago, Ill.), a French C-135FR aircraft, a USAF KC-135R aircraft, a KC-10A aircraft, a C-130 aircraft, U.S. navy Buddy Refueling stores, or any other suitable aircraft, including other types of aircraft, such as rotary aircraft, or other manned and unmanned military aircraft, including those described, for example, in The Illustrated Encyclopedia of Military Aircraft by Enzo Angelucci, published by Book Sales Publishers, September 2001, and incorporated herein by reference. Similarly, the receiver aircraft may generally be any suitable model or type of aircraft, including a fighter aircraft, a reconnaissance aircraft, a bomber aircraft, or any other suitable aircraft. The various components and subsystems of the tanker and receiver aircraft that are unrelated to the present invention and that enable these aircraft to operate are of generally known construction and, for the sake of brevity, will not be described in detail herein. Generally, the tanker and receiver aircraft 110, 120 may include one or more propulsion units coupled to a fuselage, a wing assembly (or other lifting surfaces), a tail assembly, a landing assembly, a control system, and may also include other systems and subsystems that enable proper operation of the aircraft, as shown and described in the above-referenced publication.

It will also be appreciated that a variety of alternate embodiments of the present invention may be conceived in accordance with the teachings herein, and that the present invention is not limited to the particular embodiment described above and shown in FIG. 1. Several alternate embodiments are described below with reference to FIGS. 2–4. The following discussion of alternate embodiments is not intended to be an exhaustive list of all alternate embodiments, but rather, is provided to merely demonstrate a few of the multitude of possible embodiments that may be conceived in accordance with the teachings herein. In the following discussion, similar components will be assigned similar reference numerals. For the sake of brevity, only significant differences or features of each additional embodiment will be described in detail.

Figure 2:
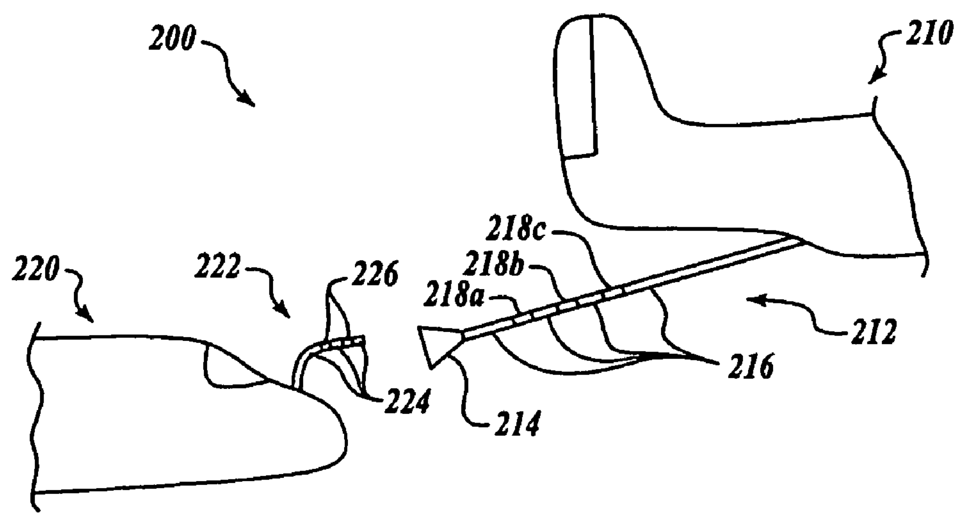
FIG. 2 is a side elevational view of an aerial refueling system in accordance with an embodiment of the present invention.

FIG. 2 is a side elevational view of an aerial refueling system 200 in accordance with another embodiment of the present invention. In this embodiment, the refueling hose 212 includes a plurality of first portions 216 and a plurality of second portions 218, however, the first portions 216 have a relatively higher density of reflective members (e.g. reflective glass beads) than to the second portions 218. Thus, when subject to passive illumination from secondary light sources, the first portions 216 will appear relatively brighter than the second portions 216, which may appear relatively darker or black.

As further shown in FIG. 2, the receiving aircraft 220 includes a receiving probe 222 having a plurality of first regions 224 and a plurality of second regions 226. Like the first and second portions 216, 218 of the refueling hose 212, the first and second regions 224, 226 of the probe 222 may include reflective members of different concentrations (or densities) so that the probe 222 and markings thereon (i.e. second regions 226) may be more visible to personnel within both the tanker aircraft 210 and the receiving aircraft 220 during both daylight and night operations, as described above.

Figure 3:
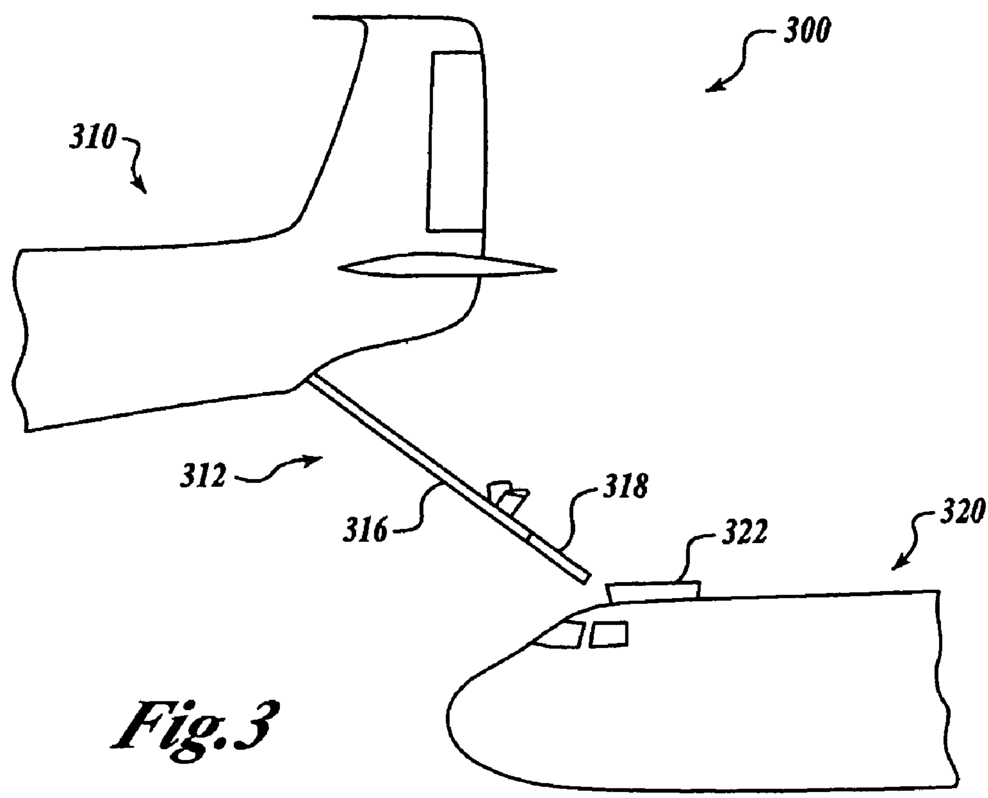
FIG. 3 is a side elevational view of an aerial refueling system in accordance with another alternate embodiment of the present invention.

FIG. 3 is a side elevational view of an aerial refueling system 300 in accordance with another alternate embodiment of the present invention. In this embodiment, the tanker aircraft 310 include a refueling boom 312 that extends downwardly to engage with a fuel receptacle 322 of the receiving aircraft 320. The refueling boom 312 may include airfoils surfaces 314 extending outwardly therefrom to provide aerodynamic control of the position of the boom 312. As described above with respect to the refueling hoses 112, 212, the refueling boom 312 includes a first portion 316 having a first reflectivity, and a second portion 318 having a second reflectivity. As described above, the reflectivities of the first and second portions 316, 318 may be provided by reflective members (e.g. reflective glass beads) that may be embedded in an outer layer of the refueling boom 312, or may be included within a paint or coating material on the first and second portions 316, 318. Thus, the above noted advantages of the present invention may be achieved in an aerial refueling system that employs a refueling boom rather than a hose and drogue combination.

Figure 4:
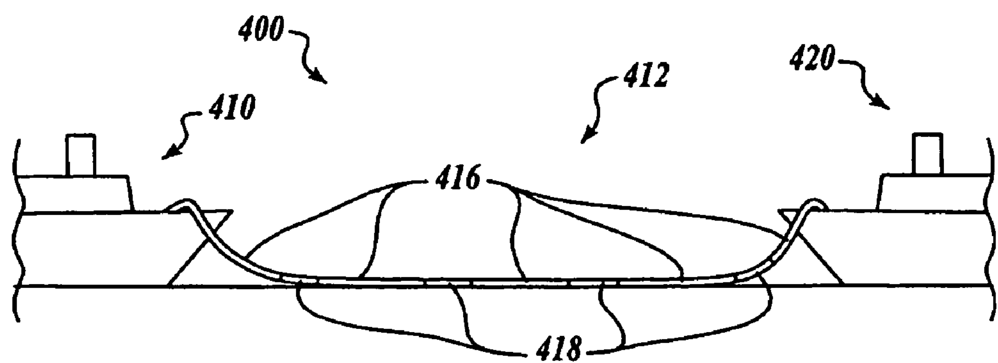
FIG. 4 is a side elevational view of a material transfer system in accordance with still another embodiment of the present invention.

FIG. 4 is a side elevational view of a material transfer system 400 in accordance with still another embodiment of the present invention. In this embodiment, the system 400 includes a tanker vessel 410, a receiving vessel 420, and a transfer conduit 412 engaged therebetween. In one aspect, the transfer conduit 412 may be at least partially buoyant so that the transfer conduit 412 will float on a body of water between the tanker and receiving vessels 410, 420. The transfer conduit 412 includes a plurality of first portions 416 and a plurality of second portions 418 having varying reflectivity provided by different concentrations of reflective materials (e.g. reflective glass beads) disposed on (or within) the surface of the transfer conduit 412. Thus, the above noted advantages of embodiments of the present invention may be realized in a material transfer system 400 particularly suited for transferring materials between ships. It is apparent that alternate embodiments in accordance with the teachings herein may be conceived for material transfer systems adapted for use between any desired types of vehicles or storage vessels, including trucks, automobiles, storage tanks, trains, spacecraft, and any other suitable vehicles or vessels.

While the preferred embodiment of the invention has been illustrated and described, as noted above, many changes can be made without departing from the spirit and scope of the invention. Accordingly, the scope of the invention is not limited by the disclosure of the preferred embodiment. Instead, the invention should be determined entirely by reference to the claims that follow.

What is claimed is:

1. A conduit for transferring a flowable material, comprising:

a wall member at least partially enclosing an inner region, the inner region being adapted to receive the flowable material and to facilitate transfer of the flowable material from a first location to a second location; and a plurality of reflective members being at least one of formed within an outer layer of the wall member and disposed on an outer surface of the wall member, the reflective members being disposed in at least one substantially continuous annular band about the wall member and adapted to at least partially reflect light incident thereon, wherein the wall member includes a first portion and a second portion, the first portion having a first concentration of reflective members and the second portion having a second concentration of reflective members, wherein the second portion of the wall member is adapted to be inserted into a receiving receptacle of an aerial refueling system, and wherein the second portion includes the substantially continuous annular band disposed about the wall member at a location corresponding to at least one of a maximum and a minimum insertion length of the second portion into the receiving receptacle for proper operation of the aerial refueling system.

2. An apparatus for transferring a flowable material, comprising:

a tank adapted to contain a flowable material;

a conduit operatively coupled to the tank and adapted to receive the flowable material and to facilitate transfer of the flowable material between the tank and a second location, the conduit including a wall member; and a plurality of reflective members being at least one of formed within an outer layer of the wall member and disposed on an outer surface of the wall member, the reflective members being disposed in at least one substantially continuous annular band about the wall member and adapted to at least partially reflect light incident thereon, wherein the wall member includes a first portion and a second portion, the first portion having a first concentration of reflective members and the second portion having a second concentration of reflective members, wherein the apparatus includes an aerial refueling system, wherein the second portion of the wall member is adapted to be inserted into a receiving receptacle of the aerial refueling system, and wherein the second portion includes the substantially continuous annular band disposed about the wall member at a location corresponding to at least one of a maximum and a minimum insertion length of the second portion into the receiving receptacle for proper operation of the aerial refueling system.

3. An aircraft, comprising:

a fuselage;

a propulsion system operatively coupled to the fuselage; and an aerial refueling system coupled to the fuselage and including;

a tank adapted to contain a flowable material;

a conduit operatively coupled to the tank and being adapted to receive the flowable material and to facilitate transfer of the flowable material between the tank and a second location, the conduit including a wall member; and a plurality of reflective members being at least one of formed within an outer layer of the wall member and disposed on an outer surface of the wall member, the reflective members being disposed in at least one substantially continuous annular band about the wall member and adapted to at least partially reflect light incident thereon, wherein the wall member includes a first portion and a second portion, the first portion having a first concentration of reflective members and the second portion having a second concentration of reflective members, wherein the second portion of the wall member is adapted to be inserted into a receiving receptacle of the aerial refueling system, and wherein the second portion includes the substantially continuous annular band disposed about the wall member at a location corresponding to at least one of a maximum and a minimum insertion length of the second portion into the receiving receptacle for proper operation of the aerial refueling system.

4. A method of transferring a flowable material, comprising:

providing a conduit operatively coupled to a tank containing the flowable material, the conduit being adapted to receive the flowable material and to facilitate transfer of the flowable material between the tank and a second location, the conduit including a wall member having a plurality of reflective members being at least one of formed within an outer layer of the wall member and disposed on an outer surface of the wall member, the reflective members being disposed in at least one substantially continuous annular band about the conduit;

illuminating the at least some reflective members with an incident light;

reflecting the incident light using the at least some reflective members; and transferring the flowable material through the conduit from the tank to the second location, wherein providing a conduit including a wall member having a plurality of reflective members includes providing a conduit including a wall member having a plurality of reflective glass beads, wherein providing a conduit including a wall member having a plurality of reflective members includes providing a conduit including a wall member having a first portion and a second portion, the first portion having a first concentration of reflective members and the second portion having a second concentration of reflective members, wherein the second portion of the wall member is adapted to be inserted into a receiving receptacle of an aerial refueling system, and wherein the second portion includes the substantially continuous annular band disposed about the wall member at a location corresponding to a minimum insertion length of the second portion into the receiving receptacle for proper operation of the aerial refueling system.

5. The conduit of claim 1, wherein the reflective members include reflective glass beads.

6. The conduit of claim 1, wherein the first concentration of reflective members is greater than the second concentration of reflective members.

7. The conduit of claim 1, wherein the wall member includes a cylindrical wall member.

8. The conduit of claim 1, wherein the wall member includes a flexible aerial refueling hose.

9. The conduit of claim 1, wherein the wall member includes a refueling boom.

10. The apparatus of claim 2, wherein the reflective members include reflective glass beads.

11. The apparatus of claim 2, wherein the first concentration of reflective members is greater than the second concentration of reflective members.

12. The apparatus of claim 2, wherein the conduit includes a cylindrical wall member.

13. The apparatus of claim 2, wherein the conduit includes a flexible aerial refueling hose.

14. The apparatus of claim 2, wherein the conduit includes a refueling boom.

15. The apparatus of claim 2, further comprising a pump operatively coupled to the tank and to the conduit and adapted to pump the flowable material from the tank to the conduit.

16. The aircraft of claim 3, wherein the reflective members include reflective glass beads.

17. The aircraft of claim 3, wherein the first concentration of reflective members is greater than the second concentration of reflective members.

18. The aircraft of claim 3, wherein the conduit includes a cylindrical wall member.

19. The aircraft of claim 3, wherein the conduit includes a flexible aerial refueling hose.

20. The aircraft of claim 3, wherein the conduit includes a refueling boom.

21. The aircraft of claim 3, further comprising a pump operatively coupled to the tank and to the conduit and adapted to pump the flowable material from the tank to the conduit.

22. The method of claim 4, wherein providing a conduit operatively coupled to a tank includes providing a conduit operatively coupled to a refueling tank of a tanker aircraft.

23. The method of claim 4, wherein transferring the flowable material through the conduit from the tank to the second location includes transferring the flowable material through the conduit from the tank to a receiving aircraft.

24. The method of claim 4, wherein transferring the flowable material through the conduit from the tank to the second location includes pumping the flowable material from the tank.

* * * * *